United States Patent [19]

Mansfield et al.

[11] Patent Number: 4,820,986

[45] Date of Patent: Apr. 11, 1989

[54] INDUCTIVE CIRCUIT ARRANGEMENTS

[75] Inventors: Peter Mansfield, Beeston; Ronald J. Coxon, Wollaton, both of United Kingdom

[73] Assignee: National Research Development Corporation, London, United Kingdom

[21] Appl. No.: 940,609

[22] Filed: Dec. 11, 1986

[30] Foreign Application Priority Data

Dec. 16, 1985 [GB] United Kingdom ................. 8530930

[51] Int. Cl.$^4$ ............................................ G01R 33/20
[52] U.S. Cl. ...................................... 324/322; 363/98
[58] Field of Search ................ 324/318, 322; 307/643, 307/644; 323/266, 274, 277, 288, 290; 363/35, 98, 124, 132

[56] References Cited

U.S. PATENT DOCUMENTS

| | | | |
|---|---|---|---|
| 3,504,204 | 3/1970 | Carrive | 307/644 |
| 4,165,479 | 8/1979 | Mansfield | 324/309 |
| 4,208,624 | 6/1980 | Miller | 324/158 D |
| 4,437,053 | 3/1984 | Bax | 323/268 |
| 4,628,264 | 12/1986 | Reedzian | 324/322 |
| 4,628,426 | 12/1986 | Steigerwald | 363/132 |
| 4,635,181 | 1/1987 | Bourgeault | 363/132 |
| 4,709,317 | 11/1987 | Iizuka et al. | 363/98 |

FOREIGN PATENT DOCUMENTS

| | | |
|---|---|---|
| 0050475 | 4/1982 | European Pat. Off. . |
| 0096468 | 12/1983 | European Pat. Off. . |
| 1596160 | 8/1981 | United Kingdom . |
| 1597258 | 9/1981 | United Kingdom . |
| 2084827 | 4/1982 | United Kingdom . |
| 2159672 | 12/1985 | United Kingdom . |

OTHER PUBLICATIONS

Patent Abstracts of Japan, vol. 5, No. 38, (P—52) [710], 12th Mar. 1981; & JP-A-55 163 464, (FUJITSU), 19-12-1980.

Primary Examiner—Stewart J. Levy
Assistant Examiner—Kevin D. O'Shea
Attorney, Agent, or Firm—Cushman, Darby & Cushman

[57] ABSTRACT

A switched coil arrangement is connected in a bridge configuration of four switches $S_1$, $S_2$, $S_3$ and $S_4$ which are each shunted by diodes $D_1$, $D_2$, $D_3$ and $D_4$ so that current can flow in either direction through a coil L depending on the setting of the switches. A capacitor C is connected across the bridge through a switch $S_5$ to receive the inductive energy stored in coil L on breaking the current flow path through the coil. The electrostatic energy stored in capacitor C can then be used to supply current through the coil in the reverse direction either immediately or after a time delay. Coil L may be a superconductive coil. Losses in the circuit can be made up by a trickle charge of capacitor C from a separate supply $V_2$.

13 Claims, 5 Drawing Sheets

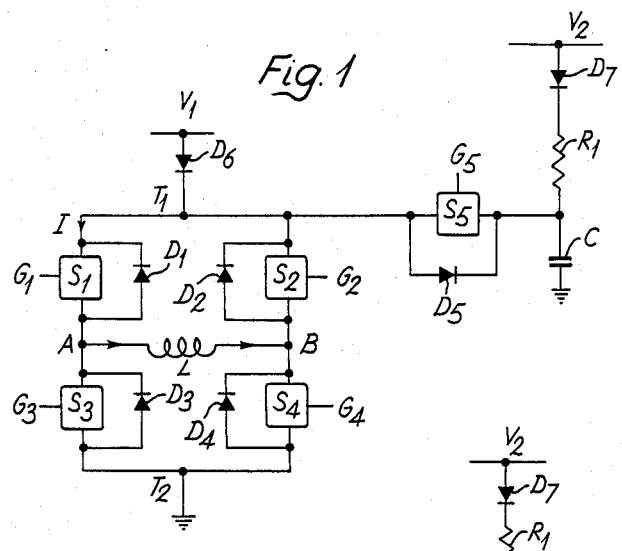
Fig. 1
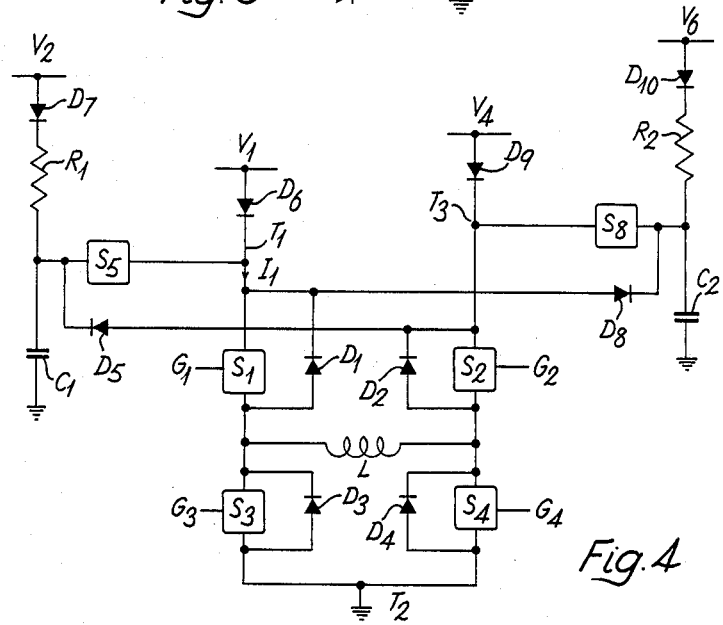
Fig. 3
Fig. 4

INDUCTIVE CIRCUIT ARRANGEMENTS

This invention relates to inductive circuit arrangements and is concerned with arrangements which enable the current flow through an inductive coil to be rapidly switched on and off or reversed.

In many applications of nuclear magnetic resonance (NMR) it is often required to switch on or off or to reverse magnetic fields and especially magnetic gradient fields and to effect such switching or reversal as rapidly as possible. Switching of magnetic gradient fields is important in NMR imaging applications especially where high speed is required. An example of such an application is in the echo planar imaging (EPI) technique as described in British Pat. No. 1,596,160. In EPI there is a requirement to switch trapezoidal gradient fields with a switching time of around 25 μs for best effect. These gradient fields are created by passing electrical currents through inductive coil arrangements which may have non-zero resistance. For low resolution imaging low currents and small coil assemblies can be utilised and it is possible to use linear amplifiers to achieve the required switching rates and gradient amplitudes. However if high resolution is required larger gradient fields must be employed and to achieve the required high switching rates extremely high power amplifiers are necessary. It is believed that this is one of the major obstacles to the commercial development of ultra high-speed NMR imaging techniques like EPI.

The power requirements for the rapid switching of current through an inductance will be appreciated from a consideration of the theoretical background. Let a step voltage V be applied to an inductance L through a resistor r then the size of current i is given by the well known expression $$i = I(1 - e^{-t/\tau}) \quad (1)$$

in which $$I = V/r \quad (2)$$

and the time constant $\tau$ is given by $$\tau = L/r. \quad (3)$$

The magnetic energy E contained in the coil at any time t is given by $$E = \tfrac{1}{2} L i^2 \quad (4)$$

The peak power $P_L$ required to establish this energy in the coil is $$P_L = dE/dt = (LI^2/\tau) e^{-t/\tau}(1 - e^{-t/\tau}). \quad (5)$$

The steady-state power dissipation $P_r$ in the coil is simply $$P_r = I^2 r. \quad (6)$$

For very low winding resistance, this power can be made arbitrarily low. However, for a given value of inductance L and rise time, equation (5) determines the peak power requirements of the driver amplifier. For linear amplifiers this situation presents something of a dilemma. Peak powers and voltages exceeding the capability of the amplifier may be required for short durations only, in order to establish the steady state current I. Then according to equation (6), the power requirement may drop to an arbitrarily low figure, though I may be high.

Linear amplifiers with both high voltage and high current capability are not readily available but in any event are an inefficient and uneconomic approach for gradient switching.

For superconductive coils, r=0 so that $\tau \to \infty$, equation (3). In this case, it would take an infinite time (in practice a long time) to establish any current through L. But having established a current, no power would be required to maintain it.

It is an object of the invention to provide an inductive circuit arrangement the switching of which requires minimal power.

According to the invention an inductive circuit arrangement comprises four switches connected in a bridge configuration, current supply terminals to opposite ends of the bridge, inductive coil means connected across the bridge so that current can flow in either direction through the coil means depending on the setting of the switches, a series connection of capacitor means and a switch connected across the supply terminals, and means for operating the said switches so as to connect the capacitor means across the coil means at least for a sufficient period of time until the current flow through the coil reduces to zero by charging of the capacitor means.

In carrying out the invention the said means for operating the switches may function subsequently to allow the capacitor means to discharge to generate current flow through the coil means in the opposite direction to the initial flow.

Preferably the said switches are shunted by unidirectional current flow devices.

It will be seen that in the operation of the above circuit arrangement the magnetic energy stored in the inductive coil is not destroyed but is transformed to electrostatic energy for storage in the capacitor means. Thus the power required to switch or reverse the current through the coil is theoretically zero since the total energy of the system comprising coil and capacitor is constant. In practice there will be minor energy losses but these can be compensated for by provided trickle charge means connected to the capacitor means to enable the capacitor means to be charged to a predetermined voltage value after discharge. It is desirable to ensure that the said predetermined voltage is greater than the voltage across the supply terminals.

It may be desirable to connect a unidirectional current flow device in series with the current supply terminals to prevent flow of current through the current supply terminals in the reverse direction.

The invention is applicable both to circuit arrangements incorporating coils having finite resistance and to circuit arrangements incorporating superconductive coils, in which case it may not be necessary to provide a potential difference across the supply terminals.

To provide start-up energy for the circuit initiating charge means comprising an additional power supply can be connected through a switch to initially charge the capacitor means to a peak voltage to provide the requisite electrical energy to establish the required current flow in the said coil means.

It may also be desirable to provide a switched parallel path across the bridge to maintain a substantially constant value of current through the current supply terminals irrespective of the settings of the switches in the bridge configuration.

In one embodiment of the invention the bridge configuration is so modified that the two arms of the bridge are connected to different current supply terminals and separate series connections each of a capacitor means and a switch are connected to each supply terminal so as to enable different values of current flow to be established through the coil in respective opposite directions.

In certain embodiments of the invention the capacitor means is used as a temporary energy store only and a second inductive coil means is provided as a more long-term store. Such an arrangement is useful where immediate current reversal in an operating coil is not required. In one such embodiment a further bridge configuration with associated further current supply terminals is provided with a further inductive coil means connected across the said further bridge configuration and the capacitor means is also connected in series with a further switch across the further current supply terminals. With such an arrangement the energy in the operating coil is first transferred to the capacitor means in the manner described above and is then transferred to the further inductive coil means where it can be stored indefinitely, with any losses if need be being made up from the voltage source connected across the further current supply terminals.

In order that the invention may be more fully understood reference will now be made to the accompanying drawings in which:

FIG. 1 is a circuit arrangement embodying the invention,

FIG. 3 illustrates a modification for FIG. 1,

Figure 5:
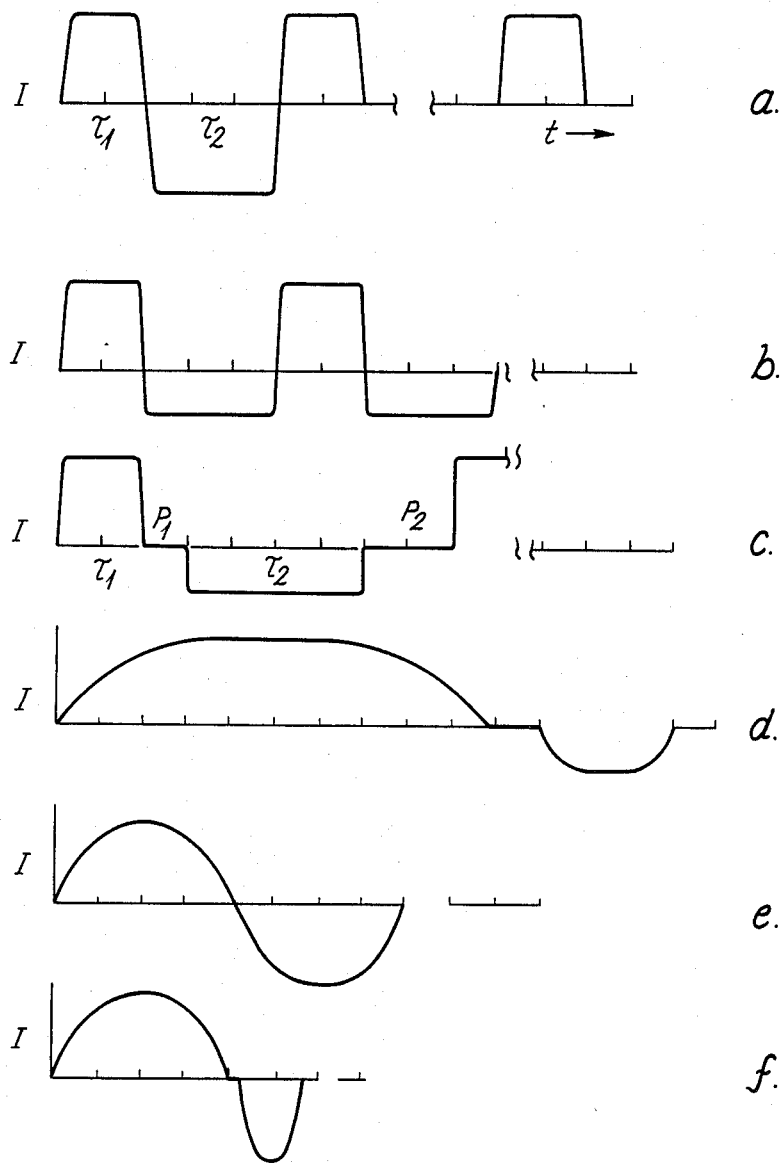
Figure 6:
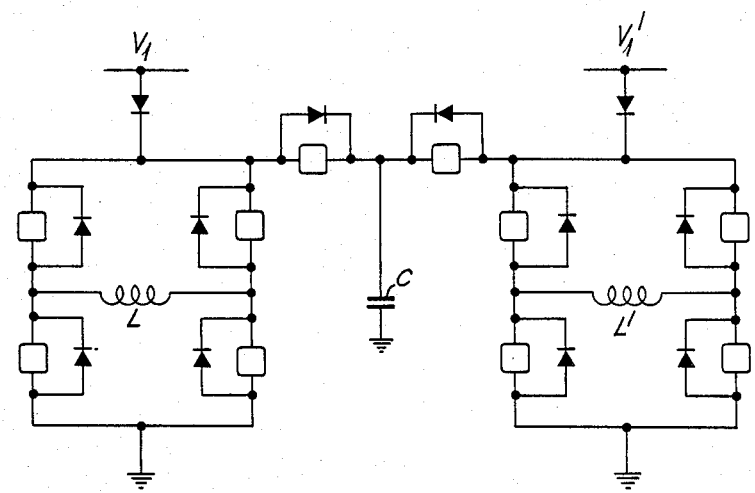
Figure 7:
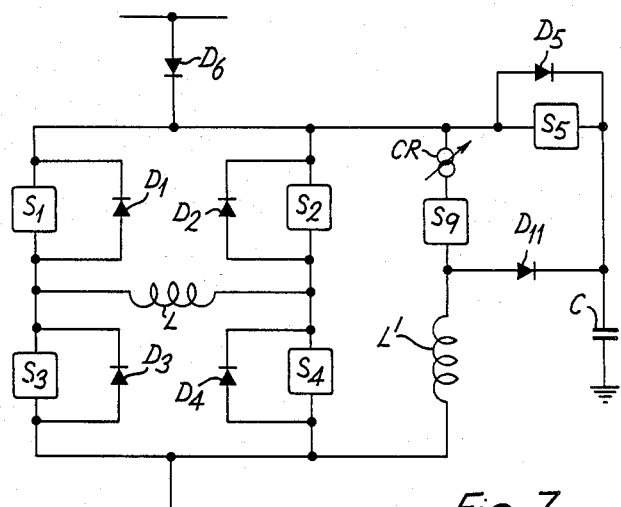
Figure 8:
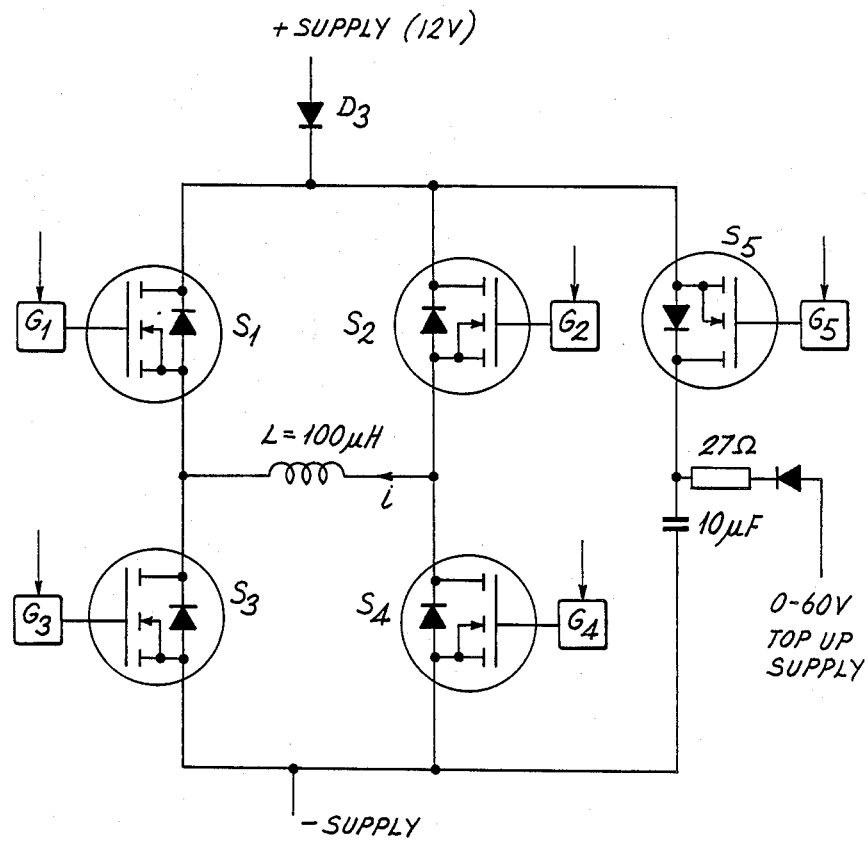

FIG. 4 is a circuit embodying the invention for enabling opposite current flows in a coil to have different amplitudes, FIG. 5 illustrates various current waveforms possible by using the invention, FIG. 6 illustrates an embodiment of the invention in which two inductive coils are used, FIG. 7 illustrates another embodiment of the invention in which a second coil is used for energy storage, and FIG. 8 is an embodiment of the invention utilising solid state switches.

Referring now to FIG. 1 there is illustrated therein a bridge configuration of four switches $S_1$, $S_2$, $S_3$ and $S_4$. Each switch is shunted by a respective diode $D_1$, $D_2$, $D_3$ or $D_4$. All the diodes are conductive in the same direction. An inductive coil L is connected across the bridge between points A and B. The bridge has current supply terminals $T_1$ and $T_2$, terminal $T_2$ being earthed and terminal $T_1$ being supplied from a voltage or current supply $V_1$ through a diode $D_6$. A series connection of a capacitor C and switch $S_5$ is connected across the bridge between terminals $T_1$ and $T_2$ and switch $S_5$ is shunted by a diode $D_5$. Capacitor C can be charged from a voltage supply $V_2$ through a diode $D_7$ and resistor $R_1$. The various switches $S_1$ to $S_5$ are controlled by signals applied along lines $G_1$ to $G_5$ respectively.

To understand the operation of the circuit shown in FIG. 1 let it be assumed initially that switches $S_1$ and $S_4$ are closed and that switches $S_2$ and $S_3$ are open. With this arrangement of the switches current will flow through coil L from terminal A to terminal B. If now at a time $t=0$ switches $S_1$ and $S_4$ are switched off simultaneously the magnetic field in coil L will collapse and will generate an emf across the coil and by Lenz's law point A will be negative with respect to point B. Point A is clamped to earth terminal $T_2$ through diode $D_3$ and since point B is therefore positive there will be a continuous path for the current flowing in coil L through diodes $D_2$ and $D_3$, diode $D_5$ and capacitor C. The energy in coil L will therefore be dumped into capacitor C where it will be stored as electrostatic energy. While this charging of capacitor C takes place switches $S_2$ and $S_3$ can be closed but the timing of their closure is not critical since current is flowing during this time through diodes $D_2$ and $D_3$. Switch $S_5$ is also closed during this time without affecting the operation of the circuit. The current through coil L reaches zero at a time $t=t_s$ at which instant capacitor C becomes fully charged to a peak value of voltage $\hat{V}_c$. The time $t_s$ is defined by $$t_s = \tfrac{1}{2}\pi\sqrt{LC} \tag{7}$$

The current flow will reverse through the now closed switches $S_2$, $S_3$ and $S_5$ and capacitor C will entirely discharge to generate a current flow of magnitude -I from B to A in the reverse direction through coil L after a time $2t_s$.

Figure 2:
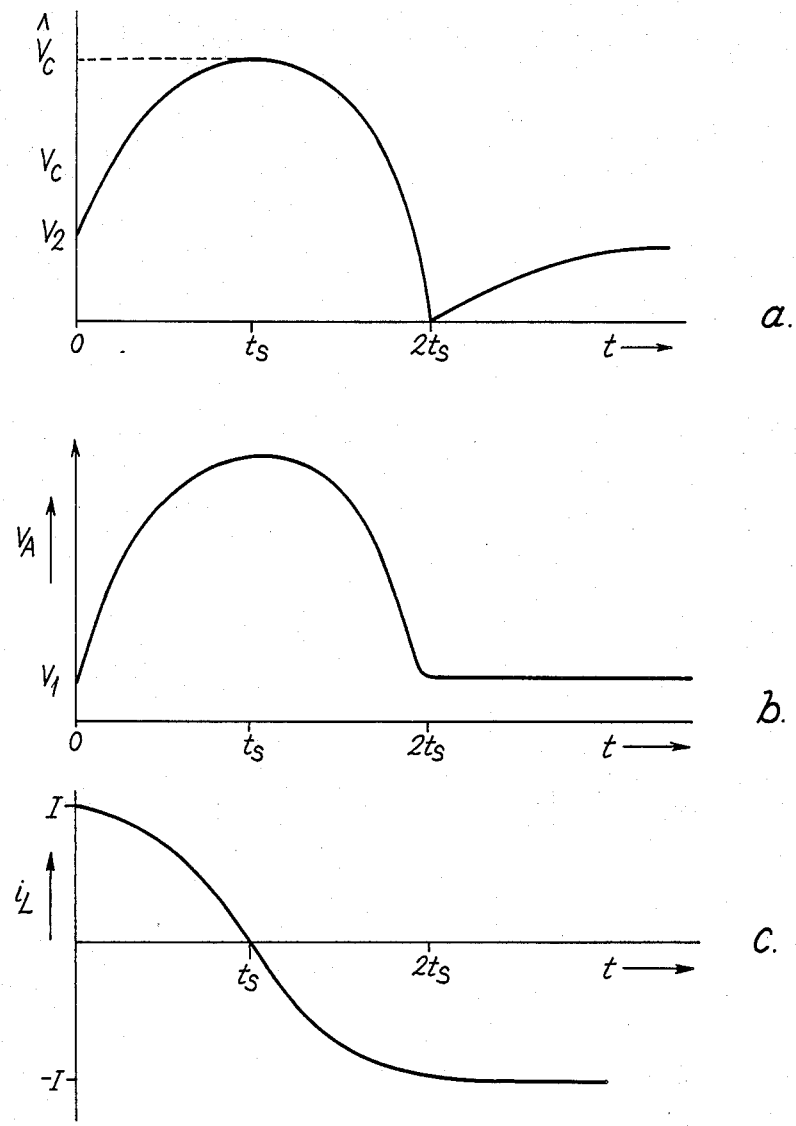
FIG. 2 shows waveforms explanatory of FIG. 1.

Neglecting the forward diode resistance, the total energy initially in the inductor at time $t=0$ is transferred to the capacitor, i.e.

$$\tfrac{1}{2}LI^2 = \tfrac{1}{2}C\hat{V}_c^2 \tag{8}$$

where $\hat{V}_c$ is the peak voltage appearing on C. Since L and C form a tuned circuit with frequency f is given by $$2\pi f = 1/\sqrt{LC} = 2\pi/4t_s \tag{9}$$

the energy transfer time or switching time, $t_s$, can be chosen by an appropriate value of C. The capacitor voltage $V_c$ during a switch, is shown in FIG. 2(a). At $t=0$, $V_c=V_2$. After energy transfer at $t=t_s$, $V_c=\hat{V}_c$. Capacitor C discharges in the next ¼-cycle through closed switch $S_5$. The discharge path is through switches $S_2$ and $S_3$ thereby establishing a reversed current, -I, through coil L. At the end of the discharge period, when $t=2t_s$, $V_c\simeq0$ and at this point in time switch $S_5$ is opened isolating C from the circuit. Thereafter the capacitor is trickle charged through resistor $R_1$ until $V_c=V_2$.

The voltage $V_A$ across the terminals $T_1$ and $T_2$ and the current $i_L$ through coil L are shown in FIG. 2(b) and FIG. 2(c) respectively. Prior to reversal, $V_A \simeq V_1$ and $i_L=I$. At time $t=t_s$, $i_L=0$ and $V_A=\hat{V}_c$. The diode $D_6$ protects the low voltage power supply during the switching operation and allows a smooth transition back to $V_1$ following current reversal. Since $D_1$ conducts when $S_1$ is switched off, a smooth transition from I to -I obtains, with no discontinuous glitches at the zero-crossing.

The voltage $V_2$ is variable and serves to make good energy losses in the system due to finite diode and switch resistances.

As described the switch works with superconductive coils.

The operation of the circuit of FIG. 1 assumed an initial steady state current flowing in the coil. However, from FIG. 2 it can be seen that at time $t=t_s$, $i_L=0$. That is to say, the circuit is switched off. The conditions to switch on from $i_L=0$ are therefore those indicated, namely $V_c=\hat{V}_c$. In order to achieve this, the circuit as it stands must be cycled prior to actual operation to establish the correct working voltages. However, capacitor C will not hold its charge indefinitely and $V_c$ will slowly decay from $\hat{V}_c$ to $V_1$ due to leakage resistance. Typical leakages allow $V_c$ to be held for up to 100 ms without problem.

To avoid droop, the circuit of FIG. 1 must be modified to take an additional power supply which acts as an initiating charge means and is capable of supplying the full peak voltage $V_c$ to capacitor C. This modification is sketched in FIG. 3, in which a supply voltage $V_3$ equal in magnitude to peak voltage $\hat{V}C$ is connected to capacitor C via a switch $S_6$. Switch $S_6$ is kept on when all other switches are off, that is, between pulse sequences and ensures that the requisite electrical energy is stored in capacitor C to establish the required current flow in coil L when desired. As soon as current is required through coil L, $S_6$ is switched off, $S_5$ is switched on and the bridge is activated. Discharge of capacitor C through the bridge immediately establishes the required magnitude of current flow in coil L. Once current is established, the operations continue as previously described. On final switch off, $V_3$ is again coupled to capacitor C via switch $S_6$.

The fact that $S_1$ to $S_4$ are initially all off means that the load on supply $V_1$ changes and voltage $V_A$ varies. This may be obviated by adding a third arm to the bridge of FIG. 1. This comprises a switched load connected between terminal $T_1$ and earth which is normally off. However, when no current through coil L is required, the third arm shunts current through diode $D_6$ to earth thereby holding $V_A$ constant.

In the FIG. 1 circuit the bridge configuration is shown as comprising four switches. Two of these switches, for example switches $S_2$ and $S_4$, may be replaced by pairs of terminals for connection to individual current supply sources which replace source $V_1$. A duplicate of capacitor C and its associated switch $S_5$ and bypass diode $D_5$ is connected to the opposite end of the bridge to switch $S_5$ and point A or B is earthed instead of terminal $T_2$. Diodes are also included at each end of the bridge.

In the circuit described in FIG. 1 the magnitude of the forward and reverse currents are equal. However, in some NMR applications, unequal magnitudes of current are required. The basic principles of switching described above can be adapted to this situation as indicated in FIG. 4.

In the circuit shown in FIG. 4 like parts have like references to FIG. 1 but in FIG. 4 the two arms of the bridge comprising the switches $S_1$ and $S_2$ are taken to two different current supply terminals $T_1$ and $T_3$ supplied from voltage sources $V_1$ and $V_4$ of different magnitudes. Separate capacitors $C_1$ and $C_2$ are connected to terminals $T_1$ and $T_3$ through switches $S_5$ and $S_8$ respectively. Terminal $T_1$ is connected to capacitor $C_2$ through a diode $D_8$ and terminal $T_3$ is connected to capacitor $C_1$ through a diode $D_5$ shunted by diodes $D_5$ and $D_8$. Capacitor $C_1$ is trickle charged from a voltage source $V_2$ through a protective diode $D_7$ and resistor $R_1$. Capacitor $C_2$ is tricle charged from a voltage source $V_6$ through a protective diode $D_{10}$ and resistor $R_2$.

Let an initial current $I_1$ flow through switch $S_1$, coil L and switch $S_4$. On turn-off of switches $S_1$ and $S_4$ capacitor $C_1$ charges, storing the initial energy $\frac{1}{2}LI_1^2$. The reverse current $I_2 \neq I_1$ then flows through switch $S_2$, L and switch $S_3$ with appropriate gating, provided that the energy equivalent of $\frac{1}{2}LI_2^2$ was previously stored on the capacitor $C_2$.

If the switching process is only seldomly repeated, the necessary peak voltages on $C_1$ and $C_2$ may be ensured by adding two circuit arrangements as described in FIG. 3.

In order to present roughly constant loads to the two power supplies, $V_1$ and $V_2$, each half of the bridge, i.e. $S_1$, $S_3$ and $S_2$, $S_4$ can be shunted by additional current switches from both $D_6$ and $D_9$ to earth.

The circuits described are capable of producing a variety of useful current waveforms. One example is a trapezoidal like burst of equal amplitude positive and negative currents with periods $\tau_1$ and $\tau_2$, see FIG. 5(a). A similar current waveform with unequal positive and negative currents is shown in FIG. 5(b). Since the circuits actually switch off at a zero-crossing, time delays $P_1$ and $P_2$ may be interposed as indicated in FIG. 5(c).

The trapezoidal edges in all cases are cosinusoidal with a rise or fall time of $t_s$, which is experimentally accessible. For rapid switching $t_s$ is short, but this may be lengthened as in FIG. 5(d). The circuit can also be used to generate true sinusoidal waveforms, FIG. 5(e) or mixed sinusoids, FIG. 5(f).

Arrangements for energy storage using capacitors have been described above. This is convenient since tuned circuits naturally interconvert between magnetic and electrostatic energy. In practice equations (8) and (9) dictate the storage capacitance and the peak voltage. Assuming the components can withstand this voltage, there is still the problem of top-up provided by the supply $V_2$ in FIG. 1, and the initiating charge provided by $V_3$ in FIG. 3. Both arrangements require relatively high voltage power supplies and in the case of $V_2$, the current drains can be significant. For one shot waveforms there is no problem. But with repeating waveforms, as used in EPI, HT (high tension) or even EHT (extra high tension) power supplies may be required.

An attractive and alternative approach is to use the capacitor C as a short term energy store, transferring the energy to another storage inductance, $L'$, placed well away from the primary coil L. A circuit arrangement is shown in FIG. 6 using two bridges and two low voltage power supplies $V_1$ and $V_1'$. If $L=L'$ then $V_1 \simeq V_1'$. Losses in the system are made up by passing extra current through $L'$. The losses referred to arise from power dissipation in the diodes and switches. Long term losses in the inductance ($I^2r$) are made up from the power supply. In a superconductive coil, these are zero. Thus once the current I is achieved in L or $L'$ the current would be maintained with no power consumption. Note that in this arrangement, capacitor C can be small. The rise time would be limited purely by the voltage capabilities of the switches and diodes. The storage capacitor is required to hold charge for only a short time and no top-up voltage source or high voltage start-up supply is required.

Although a four element bridge for storage coil $L'$ strictly speaking, is not required, the arrangement of FIG. 6 provides a more or less constant load for supply $V_1'$. As in the previous circuits, the bridge for coil L should be shunted with a third arm to provide a current drain on $V_1$ when all four switch elements of that bridge are off.

An alternative circuit is shown in FIG. 7. In this arrangement as in FIG. 1 energy is momentarily stored in capacitor C when reversing the current direction through L. However, when it is desired to switch off all four switches $S_1$ to $S_4$, the magnetic energy $\frac{1}{2}LI^2$ in coil L is first transferred to coil L' via switch $S_9$. Current through $S_9$ is controlled by a current regulator CR. The current flow through coil L' and its energy $\frac{1}{2}L'I'^2$ in coil L' is then maintained from the same supply V. A short time before current flow in coil L is required switch $S_g$ is opened and the energy in coil L' is dumped into capacitor C thus providing the necessary initial condition for start-up. This means that the current drain is fairly constant thus avoiding transient problems in the low voltage power supply. No HT or EHT top-up supplies are needed in this arrangement.

The various switches referred to can be bidirectional mechanical devices, bidirectional solid-state devices, e.g. FET's, standard high power transistors, SCR's, unidirectional vacuum tubes or gas filled thyratrons. All can be made to function with appropriate driving circuitry. Naturally for high speed operation, mechanical switches are not as useful.

A practical circuit based on FIG. 1 is shown in FIG. 8. Power FET's (HEXFETS IRF130) are used as the switches $S_1$ to $S_5$, the integral body diode of these devices being employed for the return current paths.

A switching time $t_s$ of 50 $\mu s$ was chosen in order to keep the peak capacitor voltage below the device limit of 100 V using equations (8) and (9). A capacitor of 10 $\mu F$ satisfies the requirements.

Switch $S_5$ is arranged to open between transitions after the current has settled (i.e. $2t_s$ after the last transition) to enable the capacitor voltage to be topped up to $V_2$ as described earlier and shown in FIG. 2(a). This switch closes during a transition, when energy is being transferred into C via $S_5$'s body diode or via $S_5$ itself when it has closed, and $S_5$ remains closed until the stored energy in C has been returned to the coil at time $t=2t_s$.

Each HEXFET has its own high speed opto-isolated gate drive circuit, the gate signals $G_1$ to $G_5$ are derived from TTL logic designed to supply the appropriate timings to the five gates.

In this arrangement there is no requirement for instantaneous switching or simultaneous switching of any of the devices. Also, there is always a current path in circuit with coil L, either via the devices or the diodes during transitions thus minimising the possibility of 'glitches'.

Series/parallel combinations of devices can be used for higher voltages and currents and for shorter transition times.

The circuit of FIG. 8 has been used to switch a current of 20 A through a coil L of 100 $\mu H$ with a switching time $t_s$ of 50 $\mu s$.

More powerful switches, e.g. SCR's can be used to handle very high voltages and currents (~4 kV and 1000 Amps). Suitable snubber circuits may be introduced between the anodes and cathodes of the SCR's in order to prevent their retriggering.

We claim:

1. An inductive circuit arrangement comprising:
   four switches connected to form four arms of a bridge configuration,
   current supply terminals at opposite ends of the bridge,
   inductive coil means connected across the bridge so that current can flow in either direction through the coil means depending on the setting of the switches,
   a series connection of capacitor means and a series switch connected across the supply terminals, and
   means for operating said four switches and said series switch so as to connect the capacitor means across the coil means at least for a sufficient period of time until the current flow through the coil reduces to zero by charging of the capacitor means and so as to isolate said capacitor means from the bridge configuration to enable current to continue to flow through the coil.

2. The arrangement as claimed in claim 1 in which the said switches are shunted by unidirectional current flow devices.

3. The arrangement as claimed in claim 1 in which the said means for operating the switches functions subsequently to the reduction of the current flow through the coil to zero to allow the capacitor means to discharge to generate current flow through the coil means in the opposite direction to the current flow in one direction.

4. The arrangement as claimed in claim 3 in which there is provided trickle charge means connected to the capacitor means to enable the capacitor means to be charged to a predetermined voltage value after discharge.

5. The arrangement as claimed in claim 4 in which the said predetermined voltage is greater than the voltage across the supply terminals.

6. The arrangement as claimed in claim 1 in which a unidirectional current flow device is connected in series with the current supply terminals to prevent flow of current through the current supply terminals in the reverse direction.

7. The arrangement as claimed in claim 1 in which initiating charge means is connected through a further switch to initially charge the capacitor means to a peak voltage to provide the requisite electrical energy to establish a required current flow in the said coil means.

8. The arrangement as claimed in claim 1 in which there is provided a switched parallel path accross the bridge to maintain a substantially constant value of current through the current supply terminals irrespective of the settings of the switches in the bridge configuration.

9. The arrangement as claimed in claim 1 in which the two arms of the bridge at one end thereof are connected to respective current supply terminals each at different voltage levels to enable different values of current flow to be established through the coil means in respective opposite directions.

10. The arrangement as claimed in claim 9 in which separate series connections each of a capacitor means and a switch are connected to said respective current supply terminals.

11. The arrangement as claimed in claim 1 in which further coil means is provided together with further switch means to enable energy stored in said capacitor means to be transferred to said further coil means.

12. The arrangement as claimed in claim 11 in which said further switch means also enables energy stored in said further coil means to be transferred to said capacitor means.

13. The arrangement as claimed in claim 12 in which the further switch means is connected in a bridge configuration and said further coil means is connected across the said further bridge configuration.

* * * * *